(12) United States Patent
Chang et al.

(10) Patent No.: US 6,498,367 B1
(45) Date of Patent: Dec. 24, 2002

(54) DISCRETE INTEGRATED CIRCUIT RECTIFIER DEVICE

(75) Inventors: Paul Chang, Saratoga, CA (US); Geeng-Chuan (aka Michael) Chern, Cupertino, CA (US); Wayne Y. W. Hsueh, San Jose, CA (US); Vladimir Rodov, Redondo Beach, CA (US)

(73) Assignee: APD Semiconductor, Inc., San Jose, CA (US)

( * ) Notice: Subject to any disclaimer, the term of this patent is extended or adjusted under 35 U.S.C. 154(b) by 0 days.

(21) Appl. No.: 09/520,546

(22) Filed: Mar. 8, 2000

Related U.S. Application Data

(63) Continuation-in-part of application No. 09/283,537, filed on Apr. 1, 1999, now Pat. No. 6,331,455.

(51) Int. Cl.$^7$ .......................... H01L 29/76; H01L 29/94; H01L 31/062
(52) U.S. Cl. .......................... 257/341; 257/330; 257/339
(58) Field of Search .................. 257/341, 342, 257/339, 330, 331, 355

(56) References Cited

U.S. PATENT DOCUMENTS

| | | | |
|---|---|---|---|
| 5,396,085 A | 3/1995 | Baliga | 257/77 |
| 5,416,354 A | 5/1995 | Blackstone | 257/499 |
| 5,719,411 A | 2/1998 | Ajit | 257/132 |
| 5,818,084 A * | 10/1998 | Williams et al. | 257/330 |
| 5,877,515 A | 3/1999 | Ajit | 257/76 |
| 5,886,383 A | 3/1999 | Kinzer | 257/341 |

FOREIGN PATENT DOCUMENTS

| | | | | |
|---|---|---|---|---|
| EP | 0675543 A2 * | 10/1995 | | 257/355 |

* cited by examiner

*Primary Examiner*—Steven Loke
(74) *Attorney, Agent, or Firm*—Myers, Dawes & Andras

(57) ABSTRACT

A power rectifier having low on resistance, fast recovery time and low forward voltage drop. In a preferred embodiment, the present invention provides a power rectifier device employing a vertical device structure, i.e., with current flow between the major surfaces of the discrete device. The device employs a large number of parallel connected cells, each comprising a MOSFET structure with a gate to drain short via a common conductive layer. This provides a low $V_f$ path through the channel regions of the MOSFET cells to the contact metallization on the other side of the integrated circuit. A thin gate structure is formed annularly around pedestal regions on the upper surface of the device and a precisely controlled body implant defines the channel region and allows controllable device characteristics, including gate threshold voltage and $V_f$.

7 Claims, 10 Drawing Sheets

_US 6,498,367 B1_

DISCRETE INTEGRATED CIRCUIT RECTIFIER DEVICE

RELATED APPLICATION INFORMATION

This application is a continuation in part of Ser. No. 09/283,537 filed Apr. 1, 1999, now U.S. Pat. No. 6,331,455.

BACKGROUND OF THE INVENTION

1. Field of the Invention

The present invention relates to discrete semiconductor devices and in particular power semiconductor devices. More particularly, the present invention relates to power semiconductor rectifiers including semiconductor diodes, Schoftky diodes and synchronous rectifiers.

2. Background of the Invention

Power semiconductor rectifiers have a variety of applications including applications in power supplies and voltage converters. For example, an important application of such rectifiers is in DC to DC voltage converters and power supplies for personal computers and other electronic devices and systems. In such applications, it is important to provide both a fast recovery time for the semiconductor rectifier and a low forward voltage drop across the rectifier ($V_f$). In particular, DC to DC voltage converter applications employ switched inputs and the recovery time of the rectifier used in the voltage converter will affect the dynamic losses for a given frequency of operation of the input. Also, a fast recovery time is needed for rectification of high frequency signals which are present in computers and many other electronic devices.

A low $V_f$ in turn is needed in low voltage applications including power supplies for computers and other low voltage (e.g., 12 volt and lower) electronics applications. In particular, computer applications will typically require both a five volt power supply and a 3.5 volt power supply and in the future it may be as low as a one volt power supply. In converting the input five volt power supply to a 3.5 volt power supply, the voltage converter will inevitably introduce a loss due to the $V_f$ drop across the rectifier in the converter circuit. In typical fast recovery semiconductor diodes employed in such devices, the voltage drop $V_f$ may be approximately 0.7–0.8 volts. This results in a significant percentage of available power being wasted due to the voltage drop across the rectifier. For example, as much as 40% of the available power may be wasted in a two step voltage conversion from a 5 volt input to a one volt output. As a result, a significant portion of the available power may be simply dissipated in the device due to the relatively high $V_f$. This wasted power is obviously significant in laptop and notebook computers and other portable devices relying on battery power. However, such wasted power is also a significant problem in desktop computers and other devices due to heat generation.

While it is possible to adjust the properties of the diode junction to increase the recovery speed of the diode or to reduce the $V_f$ of the diode, it is typically impossible to simultaneously lower both the voltage drop across the diode and at the same time decrease the recovery time of the diode. In computer applications the compromise is usually made in favor of fast recovery times.

Schottky diodes provide some advantages since Schottky diodes have a lower $V_f$ for a given recovery time than semiconductor diodes. Nonetheless, such Schottky diode rectifiers suffer from problems such as high leakage current and reverse power dissipation. Also, these problems increase with temperature causing reliability problems for power supply applications. Therefore, the design of voltage converters using Schottky barrier diodes can cause design problems for many applications. Also, Schottky diodes are typically more expensive than semiconductor junction diodes due to yield problems.

As an alternate approach, synchronous rectifiers have been designed which avoid some of the problems associated with both Schottky diodes and PN junction diodes for high speed low voltage applications. Conventional power MOSFETs are typically employed for such synchronous rectifiers, and gate controller ICs have been used for driving the discrete MOSFET devices in order to provide synchronous rectifiers with the desired device characteristics. The current state of such approaches to synchronous rectifiers for high performance rectifier applications is described, for example, in Bob Christiansen, et al. "Synchronous Rectification", _PCIM_, August 1998. The need for a driver IC, however, adds additional complexity and costs over simpler rectifiers.

A different approach to the problem that addresses most of the shortcomings of the Schottky diodes can be derived from an observation that the subthreshold current of a MOSFET as a function of drain voltage exhibits rectifying properties, which may be appreciated from the following equation (1):

$$\left(1 - e^{-k\frac{T}{q}V_d}\right)I_s = I_d \tag{1}$$

(See, for example, S. M. Sze, Physics of Semiconductor Devices, Chapter "MOSFET", paragraph "Subthreshold Region".) In the above expression, $I_d$ is the Drain Current; $V_d$ is the Drain Voltage and $I_s$ is an equivalent saturation current which value is mainly determined by the surface potential $\psi_s$ and the gate voltage $V_G$. Fixing $V_G$ (e.g., by shorting it to Drain) will lead to the rectifying Volt Ampere characteristic with the equivalent "barrier height" determined by the internal device parameters (gate oxide thickness, doping concentrations, surface states, etc.; e.g., reference S. M. Sze above).

An example of such approach directed to providing a power rectifier suitable for low voltage applications is described in U.S. Pat. No. 5,825,079 to Metzler, et al., issued Oct. 20, 1998. In the '079 patent, a rectifier device is described which may be viewed as a vertical MOSFET structure having a gate to drain short. This device is thus a type of a rectifier as described above. There are several attributes of the teaching of the '079 patent, which significantly undermine its practical usefulness. For example, the proposed procedure of formation of a P type body region (denoted by reference numeral 56 in FIG. 3 of the '079 patent) introduces serious yield problems in the manufacture of the device. This arises since the characteristics of the carrier concentrations in the channel region are highly susceptible to uncontrollable process variations.

This severe manufacturing problem may be appreciated by consideration of FIGS. 7A and 7B which illustrate the implantation of a P type body region 1 below an N type region 2 using a spacer 3 which serves to define the channel 4. The ideal situation is illustrated in FIG. 7A corresponding to a perfectly vertical sidewall of spacer 3 with the P layer 1 situated below the N type layer 2 with a peak concentration indicated by the horizontal dashed line. (The vertical profile of the P implant will typically have a Gaussian distribution with the dashed line in FIG. 7A corresponding to the peak of the Gaussian curve.) This perfectly vertical sidewall of spacer 3 is never achieved in practice, however, and instead a sloped sidewall is inevitably produced. This situation is illustrated in FIG. 7B. As may be appreciated by inspection of FIG. 7B, the sloped sidewall of the spacer 3 inevitably affects the penetration of the implant at the edge of the spacer region pulling the peak P dopant concentration up toward the surface as illustrated by the dashed line in FIG. 7B. As may be seen, this pulls the P region into the N type channel region affecting the threshold voltage and $V_f$ of the device.

It will be appreciated from FIG. 7B that a variation in the slope of the sidewall spacer 3 will horizontally move the region where the peak P concentration reaches the surface. Since the degree of verticality of the sidewall spacer 3 cannot be precisely controlled, this creates uncontrollable variations in the device characteristics. Furthermore, increasing the N type concentration in the contact region to reduce the on resistance of the device exacerbates the variability of the doping concentrations in the channel due to the interaction of the N++ contact region and the P concentration which has been pulled to the surface in the unpredictable manner illustrated in FIG. 7B. Accordingly, the problems of the high on resistance and the unpredictability of the dopant concentrations in the channel region adjacent the contact region, render the device of the '079 patent commercially nonviable.

In view of the foregoing, it will be appreciated that none of the existing power rectifiers provide all the desirable characteristics needed for computer power supplies and voltage converters, and other applications where both low $V_f$ and fast recovery are needed. Therefore, a need presently exists for a power rectifier device having low on resistance, low $V_f$, high speed switching capabilities as well as having controllable device characteristics. Furthermore, it will be appreciated that a need presently exists for such a device which is not unduly complex and which is readily compatible with available integrated circuit processing techniques and which may be produced at low cost.

SUMMARY OF THE INVENTION

The present invention provides a power rectifier device having low on resistance, fast recovery time and low forward voltage drop. The present invention further provides a method for manufacturing such a rectifier device which is compatible with existing semiconductor technology, which provides a high degree of reliability in device characteristics and which can provide such devices at reduced cost.

In a preferred embodiment, the present invention provides a power rectifier device employing a vertical device structure, i.e., with current flow between the major surfaces of the discrete device. The device employs a large number of parallel connected cells, each comprising a MOSFET structure with a gate to drain short via a common metallization. This provides a low $V_f$ path through the channel regions of the MOSFET cells to the source region on the other side of the integrated circuit. A precisely controlled body implant defines the channel region and allows controllable device characteristics, including gate threshold voltage and $V_f$.

In a first aspect, the present invention provides a discrete integrated circuit rectifier device, comprising a semiconductor substrate doped with a first conductivity type dopant and having a first major surface and a second major surface and a plurality of active cells on the first major surface. First and second electrical contacts on the first and second major surfaces, respectively, define a current flow path vertically between the major surfaces through the plurality of active cells. The active cells each comprise a gate oxide, a gate over the gate oxide, a highly doped contact region of the first conductivity type, a body region of a second conductivity type underlying the contact region and the gate oxide, and a channel region. The channel region comprises a portion of the body region underlying substantially all of the gate oxide. The current flow through the active cells flows through the plurality of channel regions under control of an electrical potential applied to the gates via the first electrical contact.

In another aspect the present invention provides a discrete integrated circuit rectifier device, comprising a semiconductor substrate having first and second surfaces and a plurality of pedestals formed on the first surface. A MOSFET comprising a plurality of parallel connected MOSFET cells is formed on the semiconductor substrate, the MOSFET cells controlling current flow between the two surfaces of the substrate. Each MOSFET cell comprises a spacer formed adjacent the side of a pedestal, the spacer defining the location of the MOSFET cell relative to the pedestal, a gate, a gate oxide, a contact region of a first conductivity type, a body region of a second conductivity type underlying the gate oxide and contact region, and a channel region comprising a portion of the body region underlying substantially all of the gate oxide. A common electrically conductive layer shorts the gate and contact regions of the plurality of cells to provide a two terminal rectifier device.

Further features and advantages of the present invention will be appreciated by review of the following detailed description of the invention.

DETAILED DESCRIPTION OF THE INVENTION

Figure 1A:
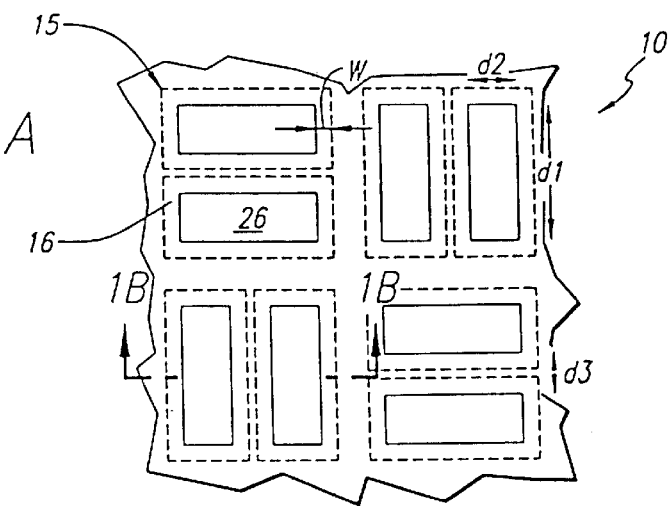
FIG. 1A is a top view of a portion of the power rectifier device of the present invention.
Figure 1B:
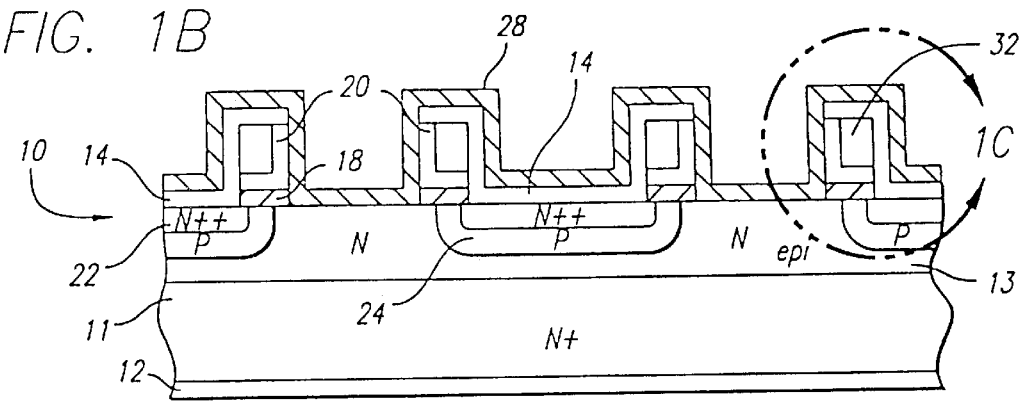
FIG. 1B is a side sectional view of a portion of the power rectifier device shown in FIG. 1A.

Referring to FIGS. 1A and 1B, the structure of the power rectifier device 10 of the present invention is illustrated in top and side sectional views, respectively. The rectifier of the present invention is a vertical device with current flowing between the bottom and top major surfaces of the integrated circuit to provide the desired high current capacity needed for applications such as voltage converters and power supplies. The current flow is thus between the source contact metallization 12 configured on the bottom surface of the integrated circuit substrate 11 shown in FIG. 1B and the drain contact metallization 14 configured on the top major surface of the substrate.

The device 10 includes a plurality of parallel connected active regions or cells 15, shown in FIG. 1A, which form a repeating pattern which covers substantially all of the top surface of the device 10 (e.g., 80% or more). A very large number of separate cells are preferably provided, for example, from a fractional number to several million or more cells 15 may be provided. In a presently preferred embodiment, for 3–20 amperes device, 0.1–2.0 million cells 15 are provided. The cells 15 have a rectangular shape and are arranged in alternating pairs. For example, each cell may have a length dimension $d_1$ of about 3.0–3.5 microns and a width dimension $d_2$ about 1.0 micron. Although a large number of separate cells 15 are presently preferred, in some cases it may be desirable to enlarge the area of individual cells to form different geometries with fewer cells. For example, elongated rectangular cells having a greatly enlarged length direction $d_1$ stretching over a substantial portion of the width of the top surface of the chip may be provided. It will be appreciated, also, that alternate geometries may be employed including various multi-sided shaped cells. In any case, it is desirable to minimize the distance $d_3$ between the individual cells 15 to maximize the current carrying area; for example, in accordance with the presently preferred process of fabricating the device 10 the distance $d_3$ between cells is on the order of 1.0–1.5 microns. In general, the distance $d_3$ below the one micron level is also following the basic teachings of the present invention.

Figure 1C:
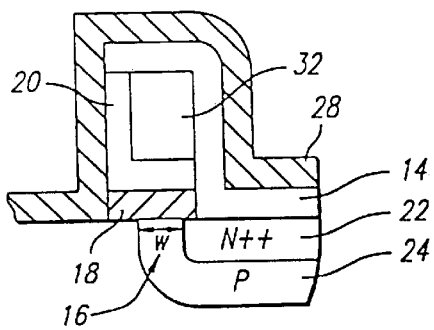
FIG. 1C is an expanded view of a portion of the structure shown in FIG. 1B.
Figure 1D:
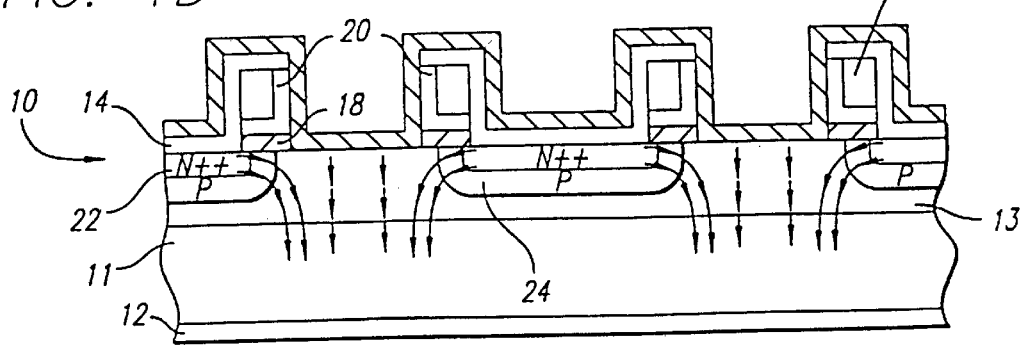
FIG. 1D is a drawing of the structure shown in FIG. 1B illustrating the current flow path through the top portion of the device.

The active cells 15 are preferably formed in an epitaxial layer 13 situated above the heavily doped semiconductor substrate 11. As shown in FIGS. 1A, 1B and 1C, each cell 15 includes a channel region 16 having a width W. The current flows from the drain contact metallization 14 to drain region 22 through a drain contact region where the metallization 14 contacts drain region 22, and passes through the annular channel regions 16, epitaxial region 13, substrate 11 and finally through to the source contact metallization 12. A gate oxide 18 and gate electrode 20 are configured over each channel region 16. The gate electrode 20 controls the current flow through the channel 16. As shown in FIGS. 1B and 1C, gate 20 is shorted to the drain contact metallization 14 which is formed over drain region 22. Also, a body region 24 is provided under the drain region 22. As will be discussed below in relation to FIG. 6A, the body region 24 is also shorted to the gate and drain. It will therefore be appreciated that the general device structure of each cell may be viewed as a MOSFET with gate to drain shorted and with a generally horizontal current flow through the channel regions 16, but an overall vertical current flow, as shown in FIG. 1D. MOSFET structures which are actively driven so as to act as rectifiers are referred to in the art as active synchronous rectifiers while MOSFET devices employing a gate to drain short can be referred to as "passive synchronous rectifiers". Therefore, the device of the present invention may be viewed as a "passive" synchronous rectifier in terms of its general electrical mode of operation. Although the device is illustrated as an N channel device it may also be provided as a P channel device and the appropriate N to P substitutions are to be understood in the Figures for such a P channel embodiment. Also, the rectifier device may be provided as either an enhancement mode device, depletion mode device or zero threshold device. An additional Ion Implantation step might be needed for the corresponding threshold adjustment and/or other adjustments in the gate and channel region properties may be made to provide operation in the desired mode and such adjustments are known to those skilled in the art.

As may be best appreciated from FIG. 1C, the width W of channel 16 is defined, under the gate oxide 18, by the drain region 22 and the P type body region 24. As discussed in the Background section, the P type body implant used to form body region 24 may have a doping profile which curves upwards towards the surface within the channel region 16. As will be appreciated by the following discussion of the method of manufacture of the invention, this does not interfere with the operation of the device or introduce variations in the device characteristics since the body region 24 is already placed at the surface through all or substantially all of the active channel region.

As will be further appreciated from inspection of FIG. 1C, the present invention employs a thin gate 20. In particular, the gate 20 may be formed from a doped (e.g., implanted) polysilicon layer having a thickness of from 200 to 1,000 Å, or about 500 Å in a presently preferred embodiment. Using Ion Implantation (for example) makes it possible to precisely control the doping concentration of the polysilicon thereby controlling the electrical characteristics of the device including the threshold voltage and $V_f$ of the device. Region 32 in turn is an artifact of the spacer process used to define the channel region of the device and comprises a doped or implanted polysilicon layer to provide good electrical contact between the gate 20 and the metallization layer 14. Alternatively, region 32 may be removed and a direct contact between gate 20 and metal 14 provided.

The rectifier device 10 also includes a number of Schottky diode structures in parallel with the MOSFET cells 15. Preferably, a Schottky diode 26 is provided for each cell 15. These provide a parallel current flow path, illustrated by the dashed lines in FIG. 1D. The Schottky diode junction is formed by a Schottky metallization layer 28 which contacts the body portion of layer 13 as best shown in FIG. 1B. As shown in FIG. 1A, the plurality of Schottky diode regions 26 are configured within the annular channel regions 16 and therefore a portion of the Schottky diode region is adjacent the parasitic body diode formed by the boundary between the N type epi region 13 and P type region 24 of each MOSFET cell. Barrier height of the Schottky diode junction formed in regions 26 is small, therefore, the parallel Schottky structure reduces carriers injected by the parasitic diodes adjacent the channel regions, reducing the recovery time of the device. This allows the recovery time of the rectifier of the present invention to be as low as Schottky diode rectifiers. Nonetheless, the detrimental features of Schottky diodes are avoided since the primary current flow path is via the MOSFET cells.

Accordingly, it will be appreciated that the present invention provides a rectifier having the desirable characteristics of both synchronous rectifiers and Schottky diodes but which is not subject to the detrimental characteristics of known synchronous rectifiers and Schottky diodes and which is readily manufactured in a cost effective manner. In particular, the present invention as illustrated provides a low on resistance, fast, and low $V_f$ power rectifier which is easy to manufacture and which has a high degree of reliability in its electrical characteristics despite inevitable process variations. Further advantages of the device illustrated in FIGS. 1A–1D will be appreciated from the discussion below of a preferred method of manufacture thereof.

Figure 2A:
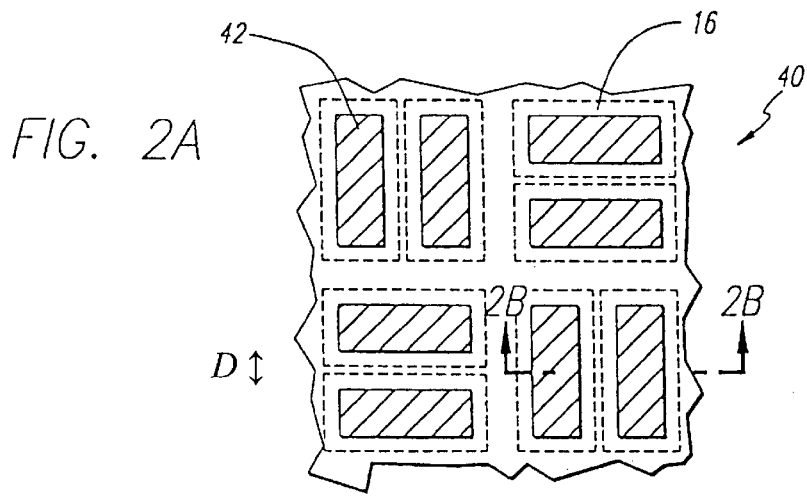
FIG. 2A is a schematic drawing of an alternate embodiment of the power rectifier device of the present invention.
Figure 2B:
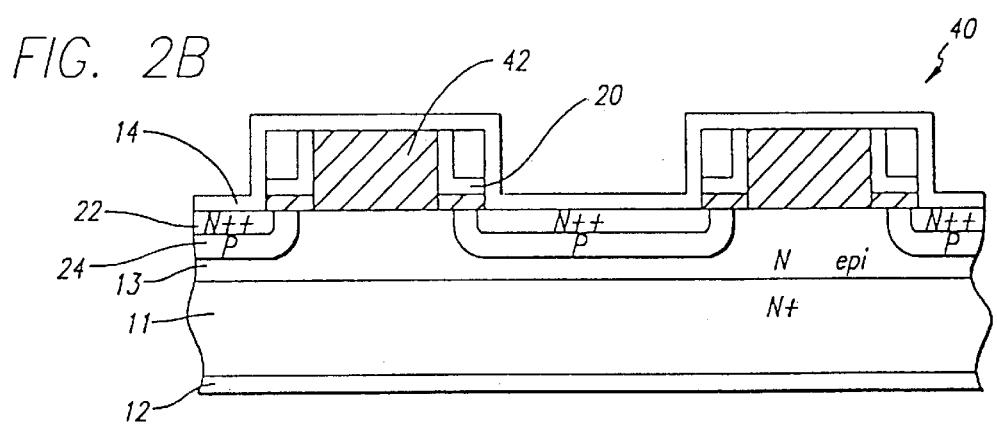
FIG. 2B is a side sectional view of the portion of the power rectifier device shown in FIG. 2A.
Figure 2C:
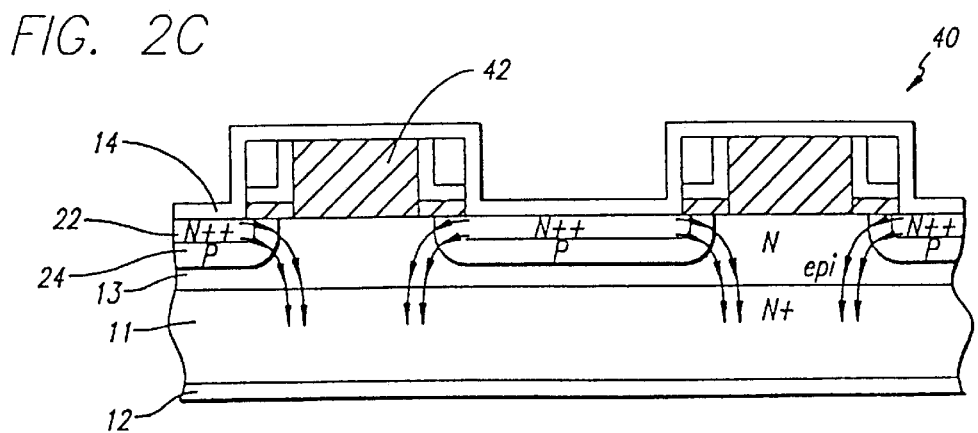
FIG. 2C is a drawing of the structure shown in FIG. 2B showing the current flow path through the top portion of the device.

Referring to FIGS. 2A–2C, an alternate embodiment of the power rectifier device of the present invention is illustrated. The embodiment of FIGS. 2A–2C provides the same MOSFET cell structure as in the previously described embodiment but replaces the parallel Schottky diode structure with a central pedestal region 42 inside the annular channel region 16 The pedestals 42 may comprise silicon dioxide ($SiO_2$) layers which serve to both define and isolate the active regions of the device. In particular, the pedestals are employed in a self-aligned fabrication method of the device as described below, which allows use of a minimal number of masking steps. (This self aligned fabrication method may also be employed for the device of FIGS. 1A–1D as will be discussed below.) Since the structure of the device illustrated in FIGS. 2A–2C is identical to that described previously like numerals are employed. Also, during normal operation, the current flow is the same as in the previously described embodiment as is generally illustrated in FIG. 2C. The absence of the parallel Schottky diode structure is the sole electrical difference between the two embodiments and there may be cost advantages due to reduced processing steps for the device 40 rendering It advantageous to employ the embodiment of FIGS. 2A–2C in some applications where the device switching speed is not critical.

As illustrated in FIG. 2A, the pedestal regions 42 are spaced apart by a distance D; e.g., approximately 1.5 microns in a presently preferred embodiment. It will be appreciated, however, that this distance D may decrease with further advances in processing technology. Also, as in the previously described embodiment, the repeating pattern of channel regions may be replaced by elongated cells or with other geometries.

Figure 3:
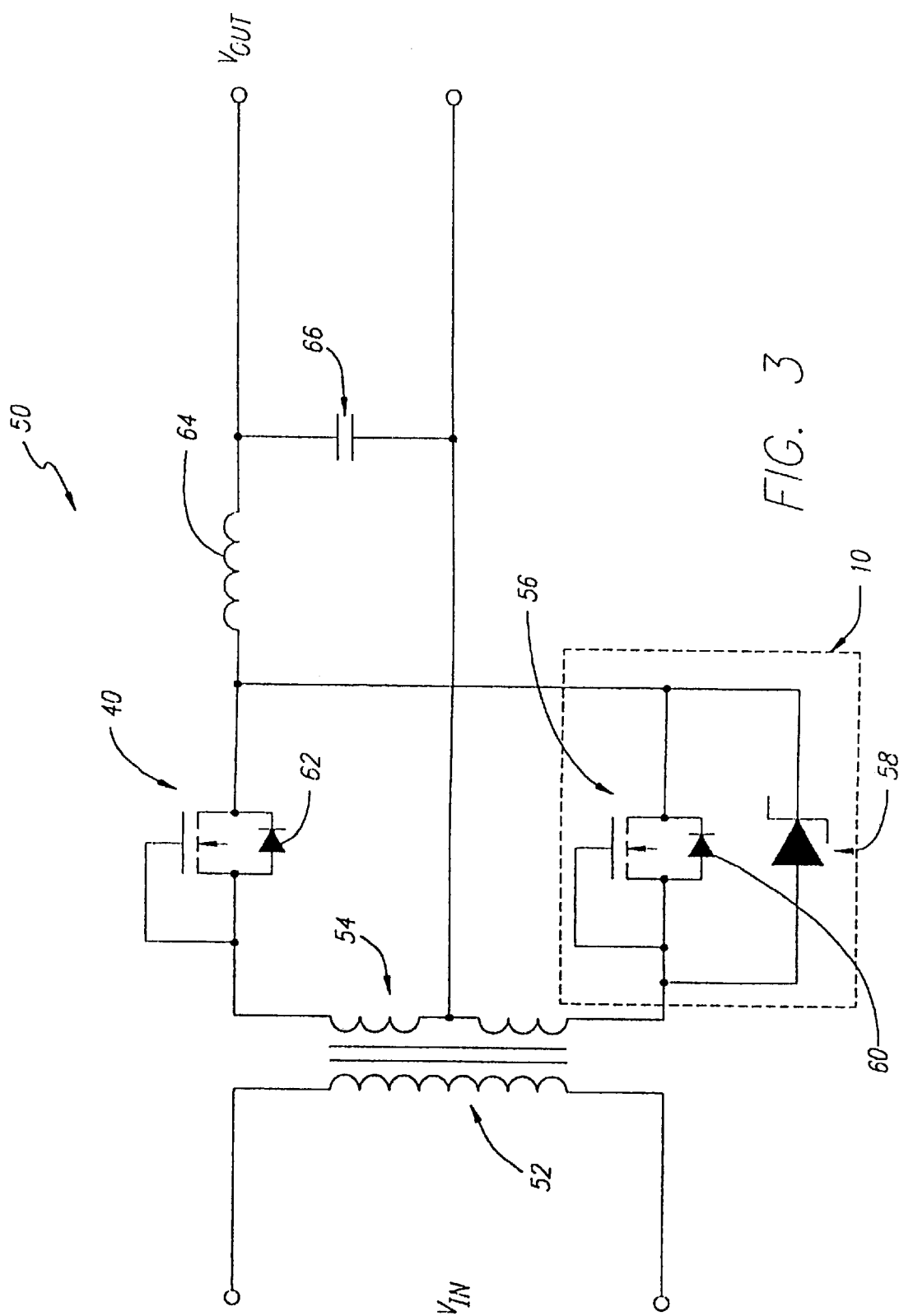
FIG. 3 is an electrical schematic drawing illustrating a voltage converter employing the power rectifier devices of FIGS. 1 and 2.

Referring to FIG. 3, an electrical schematic drawing of a voltage converter employing the power rectifiers described previously is illustrated. The converter receives an input voltage $V_{in}$ and provides an output voltage $V_{out}$ typically having a reduced voltage from $V_{in}$. For example, an input voltage of 5 volts may be provided at $V_{in}$ and an output voltage of 3.5 volts or 1 volt provided at $V_{out}$, since the voltage converter is particularly suited for low voltage applications. The voltage converter illustrated in FIG. 3 may be a DC to DC converter or an AC to DC converter. In the case of a DC to DC voltage converter, switching circuitry is provided between the input voltage terminals to provide a switched $V_{in}$. Additional circuitry in accordance with the particular application may also be employed. For example, a voltage regulator may be incorporated to provide a regulated voltage to $V_R$.

Still referring to FIG. 3, the voltage converter employs a transformer including first and second windings 52, 54, respectively, chosen to provide the desired voltage conversion. The AC output of the secondary winding 54 is provided through first and second rectifiers 10, 40 to provide a DC output $V_{out}$. As indicated by the reference numerals 10 and 40, the rectifiers may preferably correspond to the rectifier devices of FIGS. 1A–1D and 2A–2C described previously.

As indicated by the symbols in FIG. 3, the rectifier 10 may be electrically represented as a MOSFET 56, with the gate to drain shorted, configured in parallel with a Schottky diode 58. The parasitic diode in the MOSFET structure is also illustrated as reference numeral 60 in FIG. 3. Similarly, the rectifier 40 is electrically represented as a gate to drain shorted MOSFET, with the parasitic diode indicated at 62. An appropriate level of dopant concentration of body layer 24 provides for desired electrical characteristics of rectifier 40. As also illustrated in FIG. 3 an LC circuit including an inductor 64 and a capacitor 66 may be provided to smooth the output of the rectifiers 10,40.

In view of the foregoing discussion of the operation of rectifiers 10 and 40, it will be appreciated that the voltage converter circuit illustrated in FIG. 3 has significant advantages over the prior art in a variety of applications, in particular, low voltage power supplies and DC to DC converter applications for electronic devices. For example, as described above, the rectifiers 10 and 40 have low $V_f$ and low on resistance providing desirable advantages in applications involving low voltages. In particular, the heat generated from the diodes 10 and 40 as well as the power lost through such heat generation will typically be less for the circuit of FIG. 3 than prior art devices incorporating prior art discrete diodes. Also, the rectifier 10 includes a parallel Schottky diode 58 incorporated as part of the same integrated circuit as the rectifier, providing the speed advantages described above. Further features and advantages of the voltage converter circuit of FIG. 3 will be appreciated by those skilled in the art.

It will be appreciated that rectifier 40 may be implemented as an N channel depletion or enhancement mode device or a P channel enhancement or depletion mode device, or an N or P channel zero threshold device operating at the boundary between enhancement and depletion modes of operation. Thus the mode of operation may cover a range of threshold voltages, e.g., from about +1V to about −1V. Such implementations may be chosen for the needs of a particular application. Accordingly, the schematic drawing of FIG. 3 should be viewed as incorporating each of these alternate embodiments of rectifiers. Also, the rectifier 10 may be employed for both rectifiers in the circuit or the rectifier 40 may be employed for both rectifiers.

Referring to FIGS. 4A–4L, the process flow for a preferred embodiment of method of manufacturing a power rectifier device in accordance with the present invention is illustrated in a series of schematic sectional drawings. FIGS. 4A–4K illustrate a portion of the wafer as it is processed, the illustrated portion generally corresponding to the small portion of a single device illustrated in FIGS. 1B and 2B. It will of course be appreciated that in practice the structure as shown in the figures is repeated many times over the surface of the wafer in which multiple dies are processed together.

Figure 4A:
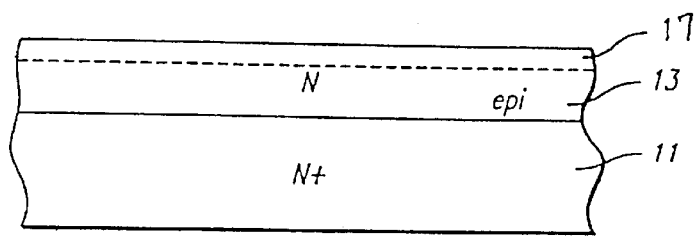
FIGS. 4A–4L are sectional schematic drawings illustrating the preferred method of fabricating the power rectifier devices illustrated in FIGS. 1A–1D and 2A–2C.

Referring first to FIG. 4A, the process of the present invention commences with an epitaxial region 13 being formed on substrate 11 in a conventional manner. The process flow will be illustrated for an N channel device and, accordingly, the epitaxial region 13 is shown as N type having, for example, As concentrations in the range of $10^{14}$ to $10^{16}$ $cm^{-3}$. If a P channel device is desired, the dopant will be P type instead of N type and it is to be understood herein that all such doped regions may simply be reversed from N to P type and P to N type to create a P channel device and such is implied for each of the following process steps.

An optional N type region 17 of higher concentration may also be provided to tailor the threshold voltage of the channel regions. Region 17 may be implanted to increase the dopant concentration levels or increased dopants may be introduced during the final growth of the epitaxial layer 13 to provide the desired increased concentration levels. The region 17 may in particular be desired if the device is operated in the depletion mode. For convenience of illustration the region 17 will be suppressed in the remaining drawings but it is to be understood that in appropriate cases, the layer 17 may be present as an upper layer of epitaxial region 13.

Figure 4B:
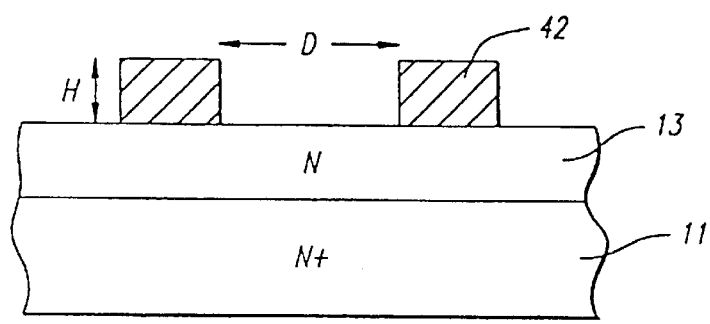

Referring to FIG. 4B, in the next step of the process of the present invention, a plurality of pedestal regions 42 are formed on the surface of the epitaxial layer 13. Pedestals 42 form the basic layout (pattern) for the active regions (or cells) and have a repetitive structure corresponding to the desired cell layout described above in relation to FIGS. 1A and 2A. Formation of the pattern of the pedestals represents the first necessary masking step in the process flow of the present invention. (In an optional embodiment described below, a prior masking step may be employed to lay out guard rings and plug regions at the edge and interior regions of the chip.) Pedestals 42 may preferably be formed of any electrically isolating materials commonly used in IC manufacturing (e.g. $SiO_2$, $Si_3N_4$, CVD Oxide, etc.) and may be grown or deposited in a conventional manner. The pedestals are spaced apart a distance D which may, for example, be about 1.0–2.0 microns and about 1.5 microns in a presently preferred embodiment. It will be appreciated that this distance may be greater or less depending on the layout geometry of the cells and also may be reduced as future technological advances allow semiconductor structures of smaller size to be created while retaining the desired control of device characteristics. The pedestals have a height H. For example, H may be approximately 0.5–1.5 microns, or about 1 micron, in a presently preferred embodiment. However, the height may be varied outside this range in accordance with the particular implementation process, the particular application of the device, and/or the semiconductor technology and equipment employed.

Figure 4C:
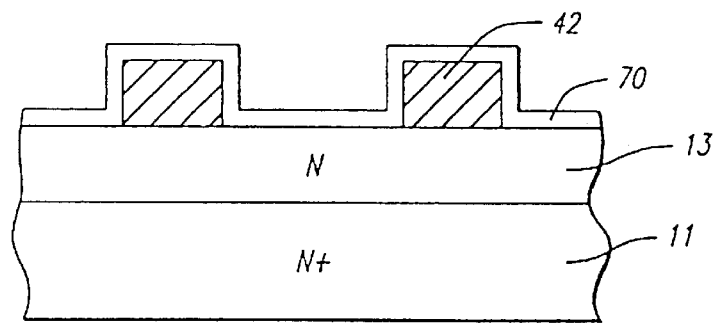

Referring to FIG. 4C, an oxide layer 70 is formed over the surface of the substrate and the pedestals, a portion of which oxide layer will ultimately become the gate oxide 18 discussed above. Preferably, a thin oxide layer is employed to allow more precise control of the threshold voltage of the device. For example, presently an oxide layer thickness of approximately 100 Å is preferred although a range from about 25 to 500 Å may be employed depending on the overall device characteristics desired.

Figure 4D:
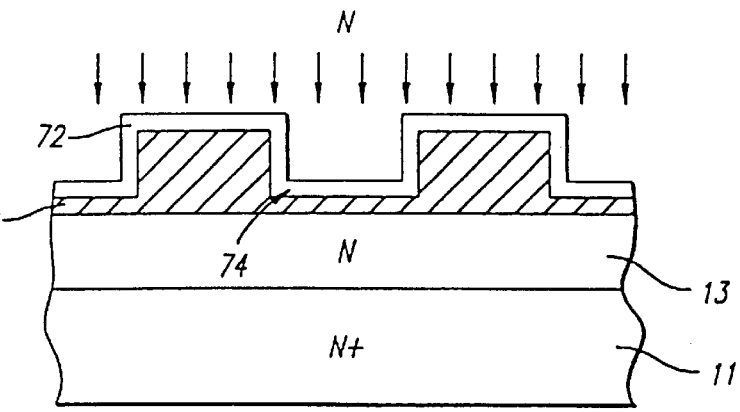

Referring to FIG. 4D, the next step of process flow of the present invention is illustrated. A doped Polysilicon layer 72 is formed on top of the oxide layer 70. The desired conductivity of the Polysilicon layer 72 can be provided by any convenient means (in situ, via Ion Implantation, etc.). (In FIG. 4D, the oxide layer 70 on top of the pedestal region 42 is suppressed since its functionality does not differ from that of the underlying pedestal region.) A portion of the Polysilicon layer 72 will ultimately become the gate regions 20 described in the embodiments of FIGS. 1A–1D and 2A–2C; therefore, it is imperative to control the dopant concentrations of the Polysilicon layer 72. The doping process itself can be by implantation as well as by other means of doping during deposition in situ, provided that the impurities do not penetrate through the gate oxide into the substrate. In a presently preferred embodiment, Polysilicon layer 72 is relatively thin, for example, from about 200–1,000 Å and approximately 500 Å. This thickness allows an implanted and RTP activated dopants into the silicon layer 72 to be achieved in a uniform manner over the portion of the layer which will ultimately form the gate structure 20. For example, an As implant in the range of $10^{19}$–$10^{21}$ $cm^{-3}$ may be provided in layer 72 (a boron implant may be employed if a P channel device is desired). Despite the thinness of layer 72, if the doping is done by Ion Implantation the portion of the Polysilicon layer 72 extending into the corner region 74 near the pedestal 42 will typically be difficult to implant with a consistent concentration level due to the presence of the vertical overhang of the layer 72. Therefore, this region 74 will preferably be excluded from the active gate region in a manner described in the following process steps. The thin Polysilicon gate deposition and implant process provided by the present invention allows a high temperature in situ doped Polysilicon deposition step to be avoided. This avoids undesirable effects due to such a high temperature step. In situ doping of the thin Polysilicon gate may be acceptable as long as it can be done at low enough temperature in order to prevent the dopant penetration into the substrate from the Polysilicon through the gate oxide.

Figure 4E:
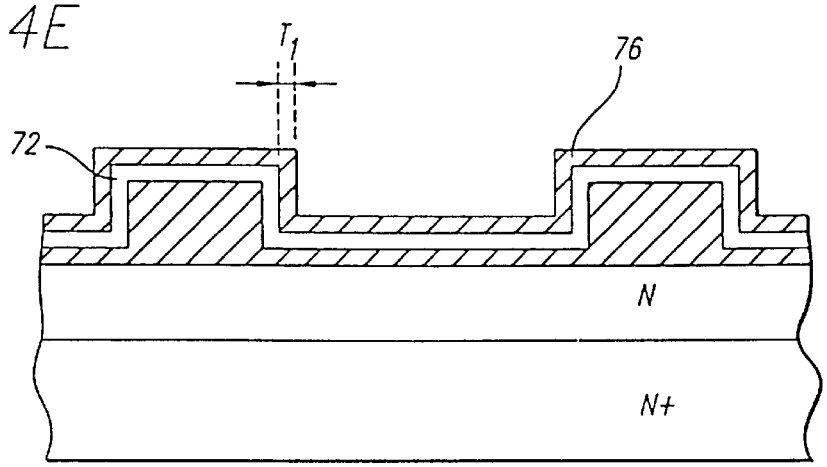
Figure 4F:
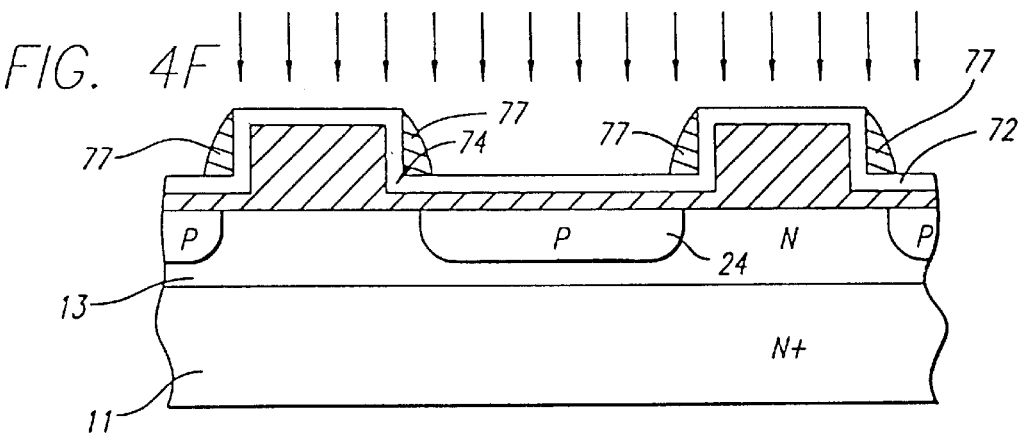

Referring to FIGS. 4E and 4F, the next stage in the process flow of the present invention is illustrated. As shown in FIG. 4E, a layer 76 is deposited on top of the polysilicon layer 72. An anisotropic etch is then employed to remove part of layer 76, leaving only the portions 77 on the sidewalls of pedestals, as shown in FIG. 4F. As will be appreciated by those skilled in the art, this is the standard spacer formation method. A blank boron implant is then performed to form p-type region 24 (or using an n-type implant to form n-type region in the case of a p-channel device). Spacers 77 are used to define the implant of the p-type body region 24 without using any photo mask. The spacers 77 are removed after the implant and the material out of which these spacers are made is therefore chosen to be suitable for a simple deposition and subsequent etching removal and may simply be an oxide layer deposited through conventional methods. The thickness of the spacer 77 is chosen to move the edge of the P implant away from the portion 74 of the gate which is not desirable for use in the active channel. For example, in a presently preferred embodiment, the spacer 77 may be approximately 1,000–10,000 Å or about 2,000 Å in particular. The implant of the P type body region may range from about $10^{15}$–$10^{18}$ $cm^{-3}$ of a suitable P type dopant such as boron (or N type dopant such as arsenic in the case of an N type body region in a P channel device).

It can be appreciated that the shape of the p-n junction created after this implantation may not be optimal for maximizing breakdown voltage. In such a case it may become necessary to employ additional steps to reshape the junction profile. This task can be accomplished either by multiple implants with different energies after the spacer has been defined or by introduction of one or more "intermediate" spacers for additional implants. In such cases the total dose will determine the peak of p-concentration at the surface and therefore resulting V threshold.

Figure 4G:
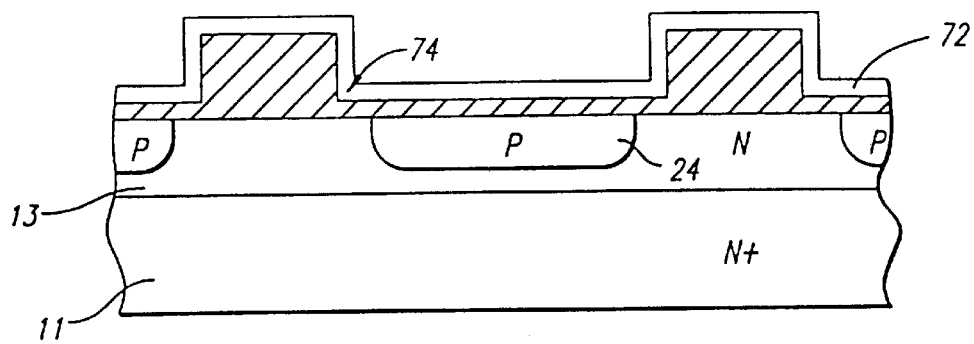

Referring to FIG. 4G, the process flow is illustrated after the first spacer layer 77 has been removed. As shown, the P type body region 24 is slightly shifted away from the region 74 of the polysilicon gate, which is subject to uncontrollable variations in the implant concentrations. Therefore, the edge of the channel region will be similarly displaced from this region and provide better control of device characteristics irrespective of unavoidable variations in implantation into the corner region 74 of the polysilicon layer 72.

Figure 4H:
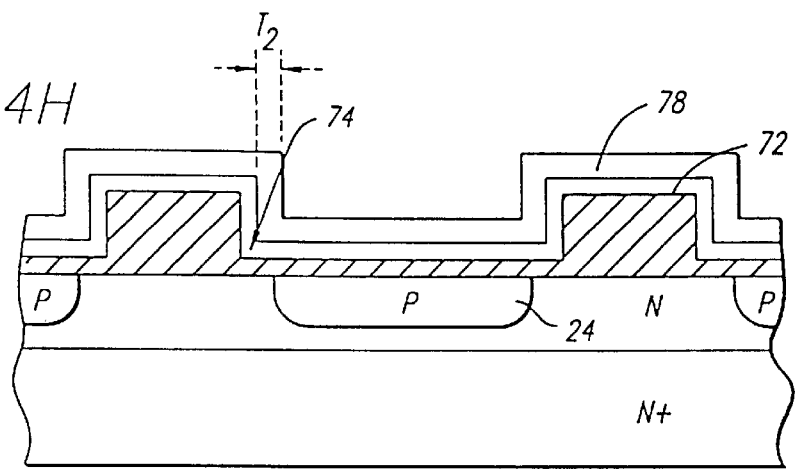

Referring to FIG. 4H, the next stage in the process flow of the present invention is illustrated. As shown, a second layer 78 is deposited on the polysilicon layer 72. Layer 78 may be Polysilicon deposited to a controlled thickness $T_2$. Thickness $T_2$ of the spacer generated by the anisotropic etch of the layer 78 is greater than $T_1$ and ensures there is no interference between the surface P concentration corresponding to the P type body region 24 and the highly concentrated N implant for the drain contact. In particular, in a presently preferred embodiment, the thickness $T_2$ of second layer 78 may be approximately 0.5 microns, but may be varied; for example, from about 0.3 microns to about 0.8 microns.

Figure 4I:
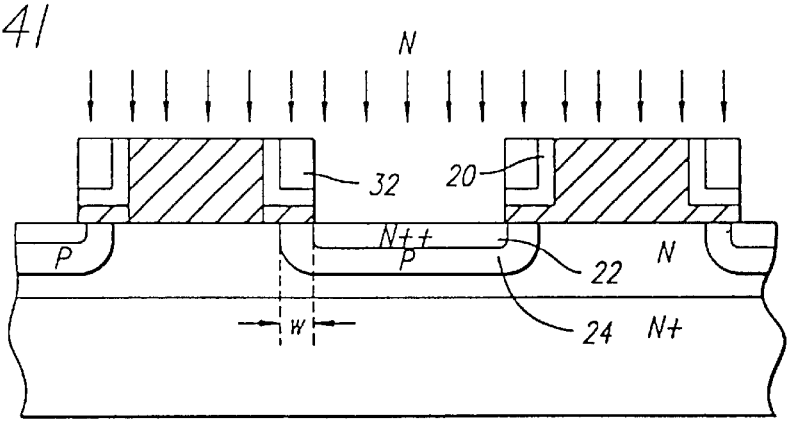

Referring to FIG. 4I, the next step in the process flow of the present invention is illustrated corresponding to reactive ion etching or other suitable anistropic etching of the layer 78 to form the composite spacer from spacers 20 and 32. This spacer formation etch can be stopped at the gate oxide or it can etch all the way down to expose the underlying silicon surface over a portion of the P type body region 24 as shown in FIG. 4I. The residual second spacer is indicated at 32. After the reactive ion etching or other anisotropic etching of the layer 78, the drain region is implanted as illustrated by the vertical lines in FIG. 4I. For example, in the case of an N type drain, arsenic may be implanted in the range of from approximately $10^{18}$ to $10^{21}$ cm$^{-3}$ to provide a highly effective contact with the metallization to be deposited over the contact region. (In the case of a P channel device, a similarly high concentration P type implant, e.g., of boron, will be provided in the contact region.) Since the residual second spacer layer 32 is polysilicon the N implant will give it a concentration level equal or greater than that of the thin polysilicon gate 20 providing a good contact to the underlying gate 20.

The drain region implantation described above may be made through the gate oxide or after the gate oxide over the drain region 22 is removed. In the former case, it is necessary to remove the gate oxide from the drain region after the implanting step in order to provide good metal contact to it. The oxide etch can be done anisotropically (RIE) as well as using wet etch. Due to the thinness of the gate oxide both methods are acceptable.

Figure 4J:
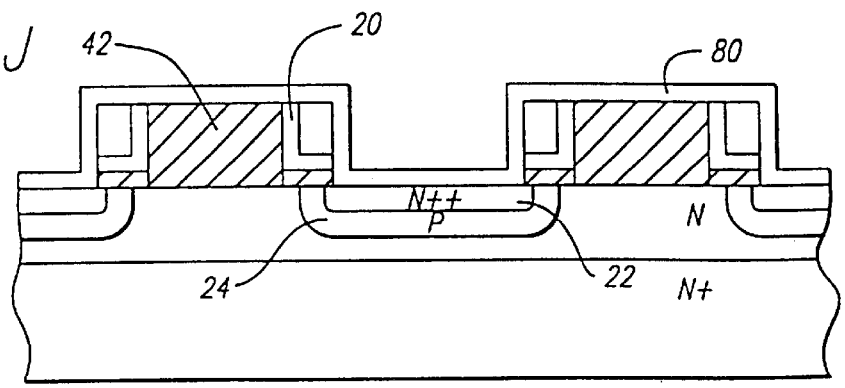

Referring to FIG. 4J, the next step in the process flow of the present invention is illustrated. As shown, a metallization layer 80 is deposited so as to make electrical contact with both the drain region 22 as well as the polysilicon gate 20. Up to the completion of the metallization layer 80, the process steps for manufacturing the two devices may be identical. Layer 80 may be any of a number of known metal contact materials; and may be for example a titanium (Ti) layer. The method proceeds with a rapid thermal-processing step which converts the titanium to titanium silicide (TiSi). For example, the rapid thermoprocessing (RTP) step may proceed at a temperature of about 600–700° C. for a short period so that the conversion process is complete but the underlying contact region 22 is not adversely affected. The process flow differs at this point depending upon the rectifier device being manufactured, i.e., whether the device illustrated in FIGS. 1A–1D or the device of FIGS. 2A–2C is to be fabricated by the process illustrated. For the processing of device 40 the process proceeds with conventional steps of formation of a barrier metal layer, e.g., TiN, on top of the layer 80. The remainder of device 40 is then formed by conventional methods including a masking step for individual chip contact metallization, thinning of the substrate 11, and formation of source contact metallization 12.

Figure 4K:
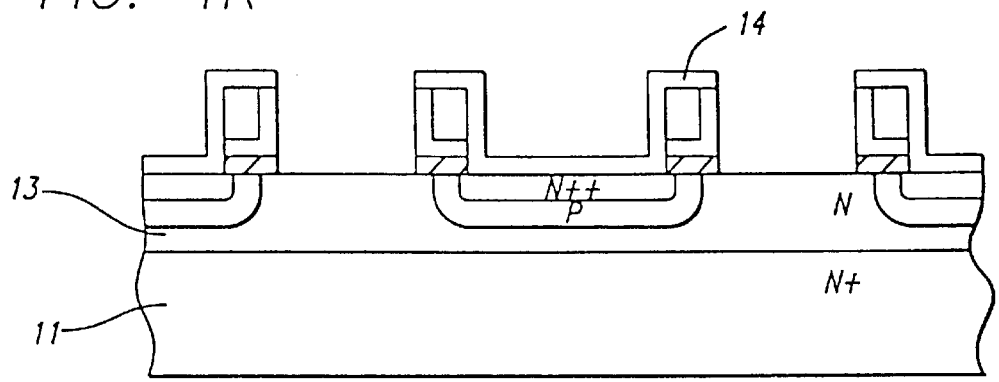

In accordance with the process flow of the fabrication of the device 10, the method proceeds to the step illustrated in FIG. 4K after the formation of layer 80. During the RTP step the open top portions of the pedestals 42 have the SiO$_2$ surface of the pedestals exposed which inhibits the formation of the TiSi. In the step illustrated in FIG. 4J the portion of metal layer 80 over the pedestal regions 42, i.e., the Ti which has not been converted to titanium silicide, is etched away exposing the underlying SiO$_2$ pedestal. This is followed by a selective SiO$_2$ etch, e.g., of HF, which etches the SiO$_2$ pedestals 42 down to the underlying silicon of the epitaxial layer 13. The resulting structure is as illustrated in FIG. 4K with the former pedestal region now being opened down to the underlying silicon with the remainder covered by the drain and gate metallization layer 14 (i.e., the residual portion of TiSi layer 80).

Figure 4L:
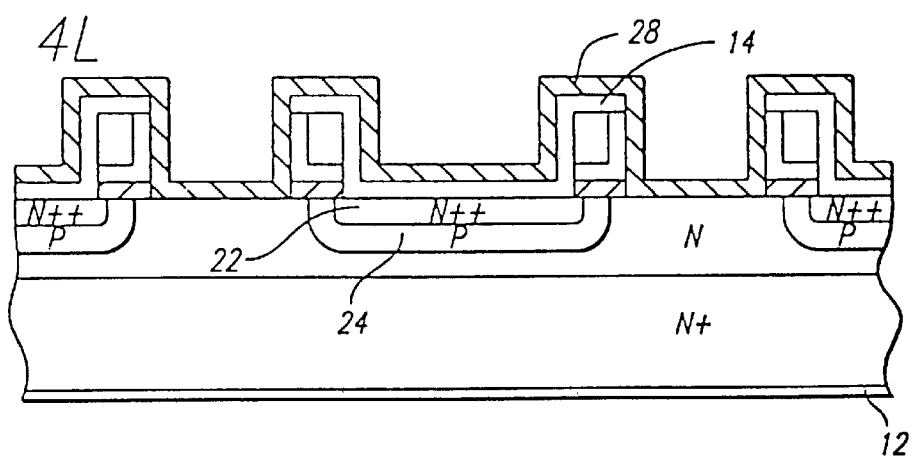

Next, the process flow of the present invention proceeds to the deposition of a Schottky barrier metal layer 28 as illustrated in FIG. 4L. Metallization layer 28 is chosen to provide the desired Schottky barrier voltage; for example, it may be composed of molybdenum, aluminum, platinum, titanium, etc. or a combination of is metals chosen to provide the desired barrier height with silicon as is known in the art. In the case of Ti is employed, layers 28 and 80 can be the same layer, and the pedestal oxide should be removed before metal deposition. The deposition of the Schottky barrier metal layer 28 is followed by a thermal processing step, for example, a rapid thermal processing step, to form the Schottky barrier at the bottom of the open pedestal regions (i.e., regions 26 illustrated in FIG. 1A). The process flow then proceeds to deposit a TiN layer or other barrier layer over the layer 28 and proceeds with conventional metallization and passivation steps. This is followed by a chip metallization masking and deposition step, thinning of the substrate 11 and formation of the source contact metallization 12, as in the case of formation of device 40.

It will be appreciated by those skilled in the art that the above process flow provides significant advantages both in the cost of the overall process, and hence cost of the devices made thereby. In particular, the described process flow only requires two masking steps, i.e., for formation of the pedestal regions 42 and for the chip metallization, which provides significant cost advantages over multi-step processes employed for formation of the power MOSFET devices employed in synchronous rectifier applications. Also, the process ensures repeatability of device characteristics and hence good yield. Furthermore, it will be appreciated that the method as illustrated provides the ability to provide a large number of active cells on the device surface since submicron device channel geometries may be provided making it possible to provide over 10 million active regions on a single integrated circuit chip. This provides low on resistance. Further advantages of the above-described process will be appreciated by those skilled in the art.

Figure 5A:
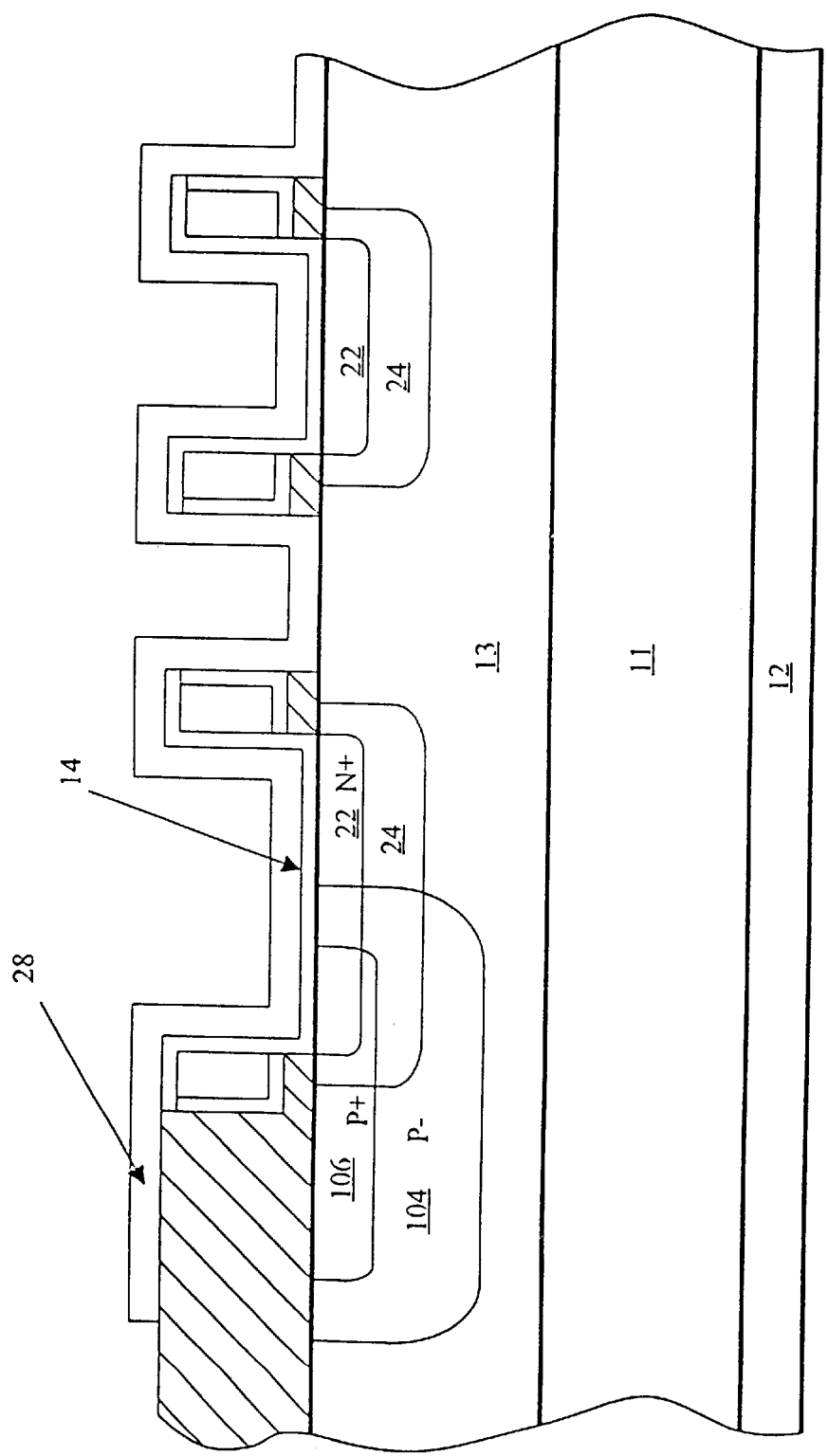
FIGS. 5A and 5B are side sectional and top views, respectively, of an edge portion of the integrated circuit chip of the rectifier device of the present invention illustrating a guard ring structure adjacent the contact pads.
Figure 5B:
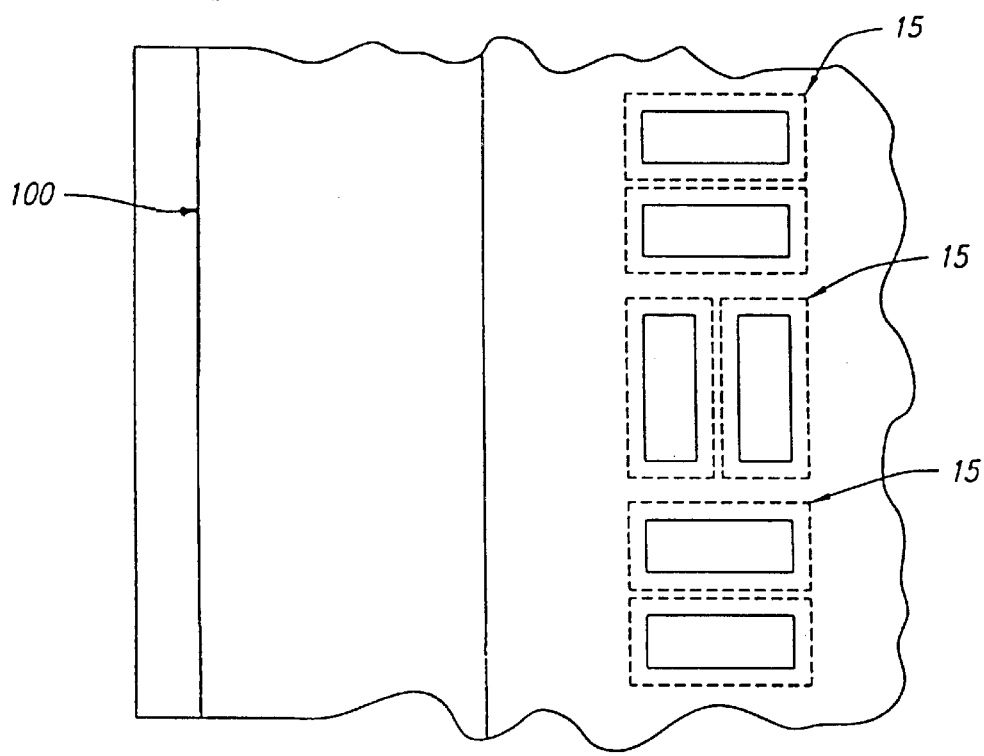

Referring to FIGS. 5A and 5B, a further aspect of the present invention is illustrated corresponding to a guard ring configuration surrounding the electrical contacts of the integrated circuit chip. The region of the integrated circuit illustrated in FIGS. 5A and 5B corresponds to an edge portion of the integrated circuit. Depending upon the particular voltage and current ranges for the particular application of the rectifier the guard ring may be necessary.

More specifically, referring to FIGS. 5A and 5B, a guard ring 100 is illustrated. The guard ring 100 may annularly extend around the entire circumference of the chip with an annular square or rectangular shape (only a section of the guard ring being illustrated in FIGS. 5A and 5B). As generally illustrated in FIG. 5B, the guard ring 100 will generally be dimensioned larger than the individual cells of the active portion of the device and, for example, may be from about 3–10 microns in width, with, for example, about five microns being presently preferred. The guard ring 100 is preferably formed of a relatively deep P− region 104 in the case of N channel active devices (or N− region in the case of P channel active devices). For example, a boron implant of about $10^{15}$–$10^{16}$ cm$^{-3}$ with a depth of about 2,000–10,000 Å may be employed. A shallower P+ contact region 106 is formed on top of the P– region 104 to provide good ohmic contact with the metallization layer. For example, the P+ contact region 106 may comprise a boron implant with a concentration of about $10^{19}$–$10^{22}$ cm$^{-3}$.

As further illustrated in FIG. 5A, the guard ring implants 104 and 106 preferably overlap the body regions 24 of the adjacent cells 15 such that the guard ring in effect provides an extension of the body regions 24 of the cells. Overlap of the Pt contact region 106 and the drain regions 22 is also allowed for a larger process latitude. In this case, the surface concentration of the contact region 106 is preferred to be significantly higher than that of the drain regions 22 so that the overlap region has a net Pt surface concentration which is high enough to form a good ohmic contact with metal layer 14. In this way, the relatively diffuse region 104 provides a low field blocking junction with the epitaxial region 13 adjacent the edge portion of the integrated circuit chip, which region is most susceptible to breakdown. Accordingly, it will be appreciated that the guard ring structure illustrated in FIGS. 5A and 5B provides significant advantages in reducing undesired breakdown of the parasitic diodes present in the active cells of the power rectifier of the present invention.

Figure 6B:
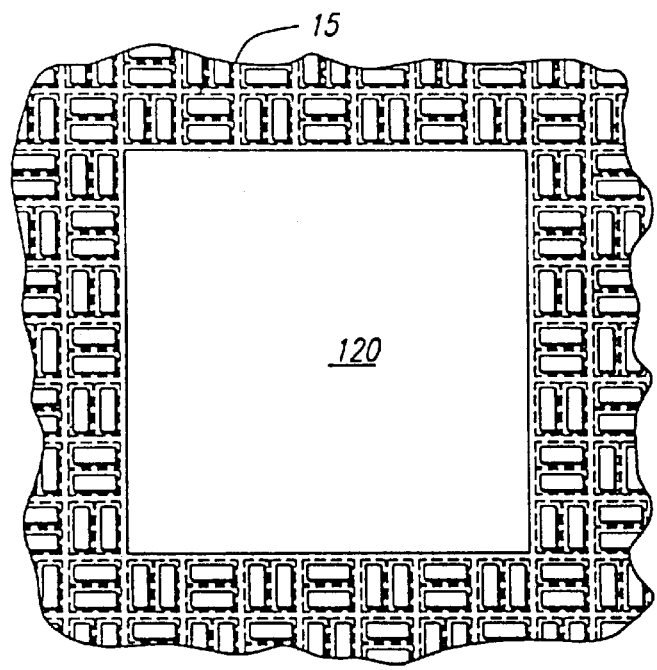
FIGS. 6A and 6B are side sectional and top views, respectively, of a central portion of the rectifier device illustrating a plug region in a further aspect of the present invention.
Figure 6A:
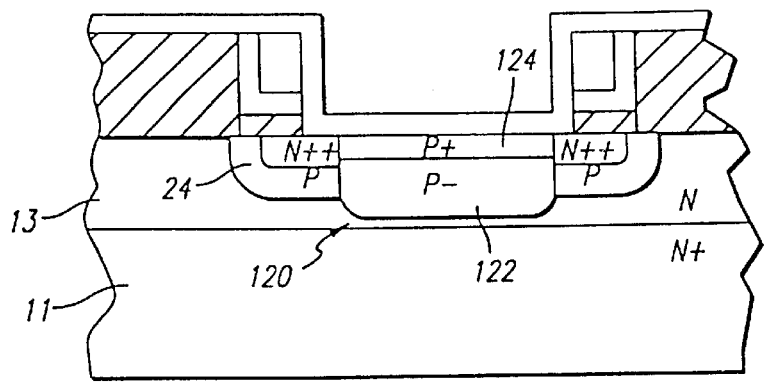
Figure 7A:
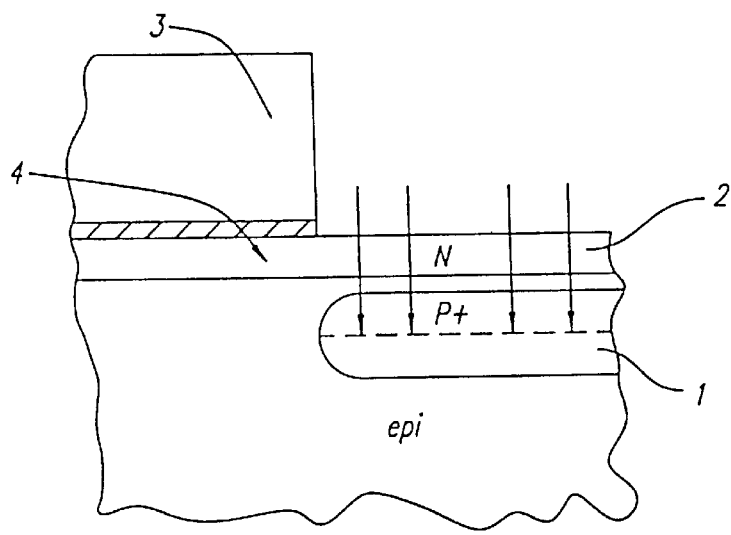
FIGS. 7A and 7B are side sectional drawings illustrating variations in the depth of an implanted region due to spacer sidewall slope variations in prior approaches to fabricating rectifier devices.
Figure 7B:
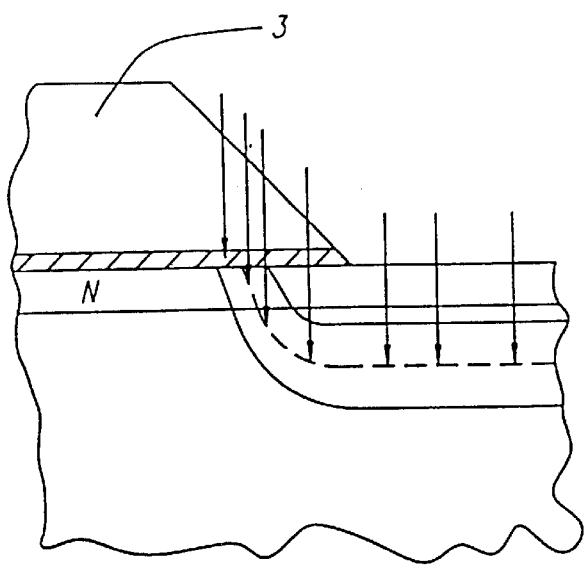

Referring to FIGS. 6A and 6B, a further aspect of the present invention is illustrated employing a plurality of plug regions 120 incorporated throughout the upper surface of the device. The plug regions 120 are provided to ensure that the active body regions 24 of the cells of the power rectifier are electrically at the same potential as the N type regions so that they do not "float". As is known in the art the presence of such floating regions can cause detrimental and unpredictable effects such as variations in switching speed or even failure of cells to switch off or on. Since the majority of the entire surface of the device is utilized as an active area, it is preferable to distribute such plugs 120 over the entire surface more or less evenly. Such a distribution provides similar resistive paths for the bleeding of charges preventing formation of areas of floating potentials. For example, the plug regions 120 may comprise approximately 1–10% of the total surface area of the device and as illustrated in FIG. 6B are situated so that the outer perimeter of the plug regions 120 are surrounded by a number of active cells 15. While a number of individual cells 15 are illustrated around the perimetry of a single plug region 120, this illustration is nonetheless not meant to be to scale and, for example, 100 active cells 15 or more may be configured about an individual plug region 120. For example, the presently preferred side dimensions of a plug region 120 may be about 30 microns. Also, while a square plug region 120 is illustrated in FIG. 6B other geometries may also be employed, for example, elongated rectangular regions or other multi-sided plug regions 120 may be employed.

The plug regions 120 may preferably comprise a relatively deep P– region 122 and a shallower P+ region 124 similarly to the two regions discussed above in relation to the guard ring structure of FIGS. 5A and 5B. For example, the P– region 122 may comprise a 2,000 to 10,000 Å deep boron implant of about $10^{15}$–$10^{18}$ cm$^{-3}$ for an N channel device region, while shallow P+ region 124 may comprise a shallow boron implant of about $10^{19}$–$10^{22}$ cm$^{-3}$. As is also shown the P+ implants for the plug regions 120 preferably are integral with the P type body regions 24 of the adjacent active cells as well as the drain regions 22 to ensure that all of these regions are held at the same potential to prevent floating of an isolated region to a different electrical potential.

Preferably, the plug regions 120 and the guard rings 100 are provided with a single masking step to define the P– and P+ implants which masking and implant steps precede the pedestal formation step described above in relation to FIG. 4B. In this case, the Pt regions 106 and 124 are formed with a single implant step, and the P regions 104 and 122 are also formed with the same process steps. This single masking step for both the plug regions and the guard rings provides a significant cost savings in the manufacture of the device since it eliminates a masking step which would increase the total masking steps of the process from 3 to 4. Since the mask formation is a significant percentage of the cost of manufacturing the device it will be appreciated that this provides a significant cost savings; e.g., as much as 20–25% of the cost of manufacturing the device. Also, the throughput of the process is increased since the additional masking step would entail additional time which would slow down the overall processing time for a given batch of wafers.

Accordingly, it will be appreciated that the present invention provides a power rectifier device and method of manufacture of rectifier devices which provide significant advantages over the prior art. In particular, such advantages include low on resistance, low forward voltage $V_f$, fast recovery time, and good reliability in the electrical characteristics of the device and hence good yield.

Furthermore, it should be appreciated that the above-described description of the preferred embodiment is merely illustrative in nature and a variety of modifications to both the device structure and the process flow may be provided while remaining within the scope of the present invention.

What is claimed is:

1. A discrete integrated circuit rectifier device, comprising:
    a semiconductor substrate having first and second surfaces and a plurality of pedestals formed on the first surface;
    a MOSFET comprising a plurality of parallel connected MOSFET cells formed on the semiconductor substrate, said MOSFET cells controlling current flow between the two surfaces of said substrate;
    each MOSFET cell comprising a spacer formed adjacent the side of a pedestal and defining the location of the MOSFET cell relative to the pedestal, a gate, a gate oxide, a contact region of a first conductivity type, a body region of a second conductivity type implant underlying said gate oxide and contact region, and a channel region comprising a portion of said body region underlying substantially all of said gate oxide; and
    a common electrically conductive layer shorting the gate and contact regions of the plurality cells.

2. A discrete rectifier device as set out in claim 1, wherein said first conductivity type is N type and said second conductivity type is P type.

3. A discrete rectifier device as set out in claim 1, wherein said spacer is composed of polysilicon.

4. A discrete rectifier device as set out in claim 3, wherein said gate is composed of polysilicon.

5. A rectifier device as set out in claim 1, wherein the current flow through the channel regions operates in an enhancement mode of operation.

6. A rectifier device as set out in claim 1, wherein the current flow through the channel regions operates in a depletion mode of operation.

7. A rectifier device as set out in claim 1, wherein the current flow through the channel regions operates in a zero threshold mode of operation.

* * * * *